United States Patent [19]

Pinneo

[11] Patent Number: 5,075,095

[45] Date of Patent: * Dec. 24, 1991

[54] METHOD FOR PREPARATION OF DIAMOND CERAMICS

[75] Inventor: John M. Pinneo, Woodside, Calif.

[73] Assignee: Crystallume, Menlo Park, Calif.

[ * ] Notice: The portion of the term of this patent subsequent to Nov. 21, 2006 has been disclaimed.

[21] Appl. No.: 413,144

[22] Filed: Sep. 27, 1989

Related U.S. Application Data

[63] Continuation of Ser. No. 204,058, Jun. 7, 1988, Pat. No. 4,882,138, which is a continuation of Ser. No. 32,169, Apr. 15, 1987, abandoned.

[51] Int. Cl.$^5$ .............................................. C01B 31/06
[52] U.S. Cl. .................................... 423/446; 427/39; 156/DIG. 68; 204/173
[58] Field of Search ............... 423/446; 156/DIG. 68; 501/86; 427/39; 204/173

[56] References Cited

U.S. PATENT DOCUMENTS

| | | | |
|---|---|---|---|
| 3,207,582 | 9/1965 | Inoue | 204/173 |
| 3,630,678 | 12/1971 | Gardner | 423/446 |
| 3,661,526 | 5/1972 | Angus et al. | 423/446 |
| 4,275,050 | 6/1981 | French et al. | 423/446 |
| 4,434,188 | 2/1984 | Kane et al. | 427/39 |
| 4,490,229 | 12/1984 | Mirtich et al. | 423/446 |
| 4,495,044 | 1/1985 | Banks | 423/446 |

FOREIGN PATENT DOCUMENTS

| | | | |
|---|---|---|---|
| 0160829 | 1/1985 | European Pat. Off. | 423/446 |
| 60-103098 | 6/1985 | Japan | 423/446 |
| 60-118694 | 6/1985 | Japan | 423/446 |
| 60-195094 | 10/1985 | Japan | 423/446 |
| 60-231498 | 11/1985 | Japan | 423/446 |
| 61-236691 | 10/1986 | Japan | 423/446 |

*Primary Examiner*—Robert Kunemund
*Attorney, Agent, or Firm*—Kenneth D'Alessandro

[57] ABSTRACT

Processes are provided for consolidating diamond particles into a mechanically stable diamond mass, called a diamond ceramic. A compacted aggregation of diamond particles is subjected to low pressure PECVD conditions in the presence of atomic hydrogen, with or without a carbon source gas, whereby a mechanically stable diamond ceramic is formed substantially devoid of interstitial spaces.

3 Claims, No Drawings

METHOD FOR PREPARATION OF DIAMOND CERAMICS

This is a continuation of Ser. No. 204,058, filed June 7, 1988 now U.S. Pat. No. 4,882,138 which is in turn a continuation of Ser. No. 032,169, filed Mar. 30, 1987, now abandoned.

The present invention is directed to a method for preparing consolidated masses of diamond particles, referred to as diamond ceramic. In particular, the present invention is directed to a method for using low pressure metastable diamond deposition techniques to consolidate diamond particles.

BACKGROUND OF THE INVENTION

Diamond is an allotrope of carbon which is metastable at ordinary pressures, having a large activation energy barrier which prevents conversion to graphite, which is the more stable allotrope at ordinary temperatures and pressures. In addition to its value as a precious gem, the uses of diamond include many industrial applications such as polishing, grinding, sawing and drilling, as windows in high pressure cells, in diamond microtone knives for biological and medical uses, as a radiation detector, for temperature measurement, as heat sinks, as wire drawing dyes, styli for phonographs and as hardness indenters. Thus numerous approaches have been utilized to attempt to synthesize diamond.

One approach known in the prior art is to utilize high pressure methods since at high pressures diamond, rather than graphite, is the thermodynamically stable form of carbon. However, heretofore, high pressure methods have met only with limited commercial success since only small diamond crystals have been made, which are suitable mainly for use as abrasives and in forming sintered preforms for use as wire drawing dyes or tool bits. Moreover, the product of high pressure diamond synthesis is often contaminated with impurities of more or less uncontrollable concentration and distribution, rendering such diamond unsuitable for a number of important technical applications.

There have been attempts to grow diamond under low pressure conditions which, at first impression, may seem to be against thermodynamic principles. However, upon crystallization at low pressures using free carbon atoms, the carbon atoms, during their fall from a state of higher free energy, may be made to pause (i.e. crystallize) at the level of diamond, instead of forming graphite. Therefore free carbon atoms with a higher free energy than that in diamond may be made to crystallize as diamond under suitable conditions, thus the metastability of diamond alone is not a deterrent factor of obtaining diamond at atmospheric or reduced pressure. Moreover, metastable phases, such as diamond, may be made to grow in the stability field of another phase, when nucleation and growth is facilitated by providing seeds of the required phase or a substrate which allows epitaxial overgrowth. Thus there are numerous diamond growth utilizing low pressure epitaxial crystallization of diamond. However, these gas phase synthesis techniques suffer from the problems of extremely low growth rates and/or the inevitable problem of interruption of growth due to formation of graphite. Once the graphite is formed, being the favored thermodynamic product at low pressure, it overtakes and inhibits further diamond growth. In order to maximize the time available for diamond growth before the appearance of graphite, the vapor pressure of the carbon bearing gas has been usually kept quite low, thus leading to very slow diamond deposition rates, typically about 0.1 micron/hour.

It has only recently been reported that atomic hydrogen is important to epitaxial diamond growth. Pate (Ph.D. thesis, Stanford University, 1984), elucidated the suggestion by Russian workers (Varnin, et al. *Soviet Physics - Crystallography* 22(4), pp. 513-515, 1977) that atomic hydrogen, adsorbed on the diamond epitaxial surface, acts to stabilize carbon $sp^3$ bonding (diamond bonding) rather than $sp^2$ bonding (graphitic bonding), thereby favorably altering the kinetics of diamond-bond-formation carbon atoms and the growing diamond surface. Without atomic hydrogen, or other means of achieving the desired effect of stabilizing or enhancing $sp^3$ bond formation versus $sp^2$ bond formation, diamond growth by low vapor deposition is relatively inefficient and undesirable graphite deposition occurs rapidly.

There are many processes known in the art in which diamond is synthesized under high pressure at which diamond is the thermodynamically stable form of carbon. Although there are many variations of this technique, a typical technique involves use of a suitable carbon solvent such as a transition metal alloy, and a carbon source which are compressed and heated in an apparatus capable of providing pressures of at least 60 kilobars at temperatures above 1500° C. The carbon is dissolved, transported, and deposited as diamond crystals but the carbon transport rate is governed primarily by diffusion, and therefore is very low. Thus the growth rates are slow and long deposition times are required to grow large diamonds. Furthermore because of the high pressures and temperatures required, the apparatus is necessarily bulky, expensive. Furthermore, because of the relatively small active volume, high pressure deposition precludes effective use of mechanical techniques (such as stirring) which might improve growth rates and product quality.

It is therefore an object of the present invention to provide a method for low pressure vapor phase metastable diamond synthesis whereby large mechanically stable diamond masses may be produced.

It is another object of the present invention to provide a method for consolidating diamond particles, or diamond-coated particles, into a large mechanically stable diamond mass substantially devoid of interstitial spaces.

It is yet another object of the present invention to provide a method for low pressure vapor phase metastable diamond synthesis wherein the free carbon atoms are deposited in the presence of atomic hydrogen to improve deposition of diamond over the formation of graphite.

It is yet another object of the present invention to provide a method for low pressure vapor phase metastable diamond synthesis in the presence of atomic hydrogen, whereby the atomic hydrogen is provided by dissociation of molecular hydrogen upon a catalytic matrix.

These and other objects of the present invention will be apparent to those skilled in the art from the following description of the preferred embodiments and from the appended claims.

SUMMARY OF THE INVENTION

The present invention provides a method for consolidating diamond particles into a mechanically stable diamond mass comprising the step of contacting a compacted aggregation of diamond particles or diamond-coated particles with a gaseous carbon source and atomic hydrogen under conditions whereby diamond is epitaxially deposited onto the diamond particles, causing the particles to consolidate into a mechanical stable diamond mass substantially devoid of interstitial spaces. The atomic hydrogen is generated, in one embodiment, by applying non-thermal energy to the particulate mass while exposing the mass to molecular hydrogen. In another embodiment the atomic hydrogen is formed by dissociating molecular hydrogen upon a catalytic matrix.

DETAILED DESCRIPTION OF THE PREFERRED EMBODIMENTS

The present invention is directed to a method for consolidating diamond particles into a mechanically stable diamond mass which will be referred to hereinafter at times as a diamond ceramic. The term ceramic in this context is intended to mean a material consisting in whole or in part of a nonmetallic hard mass substantially free of interstitial spaces. The term diamond in the following context will have its normal meaning, that is, a substantially transparent hard, strong allotrope of carbon consisting of $sp^3$-bonded carbon atoms which is thermodynamically stable at elevated pressures. As used herein, the term diamond is also intended to encompass $sp^3$-bonded carbon such as Lonsdaleite, as well as other polytypes and allotypes of carbon which have properties similar to those of $sp^3$-bonded carbon.

The process according to the present invention utilizes as starting materials a compacted aggregation of diamond seed particles. By the term compacted it is not meant that the particles are necessarily placed under a positive pressure, but it does mean that the particles are held together in contact with one another, such as after being poured into a mold of a desired shape. Such compaction may be effected through mechanical pressure, vibration, or other means. The particles will be subjected to conditions of diamond deposition using low pressure carbon source gas, for example, under conditions typically known in the art as plasma enhanced chemical vapor deposition (PECVD). Low pressure growth of diamonds on seed crystals typically occurs at pressures of about $10^{-2}$ to $10^3$ torr at temperatures ranging from about 800° to 1450° C. such as disclosed for example in U.S. Pat. Nos. 3,630,678 and 3,030,188. Typical gases are methane, ethane, and hydrocarbons such as dichloromethane, chloroform, carbon tetrachloride, or acetone.

Typical deposition conditions according to the present invention utilize carbon source gas pressures in the range of $10^{-3}$ to $10^3$ torr and temperatures of from about 20° to 1000° C. Particularly preferred conditions are carbon source gas pressures of 10 to 50 torr and at temperatures of 650° to 850° C. While not intending to be bound to a particular theory, it is believed that, at such temperatures, concurrent with the carbon deposition there also occurs a process of sintering whereby the diamond particles are caused to grow together by the action of the heat and continuous vaporization and redeposition of carbon atoms from the surfaces of the diamond particles in such a fashion as to cause the intergrain voids to migrate to the edges of the mass, thereby substantially eliminating interstitial spaces and causing the mean density and hardness to increase.

It is also important to the operation of the present invention that there be a source of atomic hydrogen which provides atomic hydrogen at the surface of the growing diamond particles. Atomic hydrogen may be provided by using molecular hydrogen in the chemical vapor deposition stream. This may be provided by applying a source of non-thermal energy at or near the surface of the diamond particles to cause dissociation of molecular hydrogen into atomic hydrogen. The non-thermal energy may be provided by resistive, inductive, radiant or other sources of energy which produce the required temperature within the particulate diamond mass. Means for producing atomic hydrogen include, but is not limited to, electric discharges (initiated and/or sustained by direct current), low frequency alternating current, radio frequency radiation, microwave radiation, ultraviolet radiation, penetrating radiation such as x-rays, gamma rays, alpha rays, beta rays, or neutron radiation. The applications of such non-thermal sources of energy are applied as the gas mixture flows through the heated particle volume, whereby diamond is deposited on the surface of the grains in the mass, gradually closing the interstitial spaces among the grains and producing a consolidated hard mass of particles which is mechanically tough and possesses the desirable mechanical, thermal, chemical and electrical properties of diamond. The flowing gas mixture may also comprise an appropriate inert gas such as helium to modify ionization thresholds and deposition kinetics, as desired, and to optimize the deposition parameters.

Alternatively, the atomic hydrogen may be provided by a substantially non-thermal dissociation of molecular hydrogen upon a catalytic matrix. This may be done for example, by accelerating a directed high pressure stream of molecular hydrogen gas onto a catalytic surface, such as platinum, the catalytic matrix being of sufficient density and thickness whereby the molecular hydrogen enters into and passes through the catalytic matrix, appearing on the other side of the catalytic surface as atomic hydrogen. Many such catalytic surfaces may be utilized which are known from the art of hydrogenation, such as platinum, palladium, nickel, Raney nickel, lead, and other hydrogenation catalysts. The preferred catalytic matrix for dissociating molecular hydrogen to atomic hydrogen for the present invention is palladium.

As discussed hereinabove, the presence of atomic hydrogen at the growing diamond surface is important to epitaxial growth of diamond at the particle surface and suppresses, or may even eliminate, the formation of graphite. Other agents which enhance the mobility of carbon atoms on the particle surfaces may be utilized in conjunction with the use of atomic hydrogen as described above. Use of atomic carbon mobility-enhancing agents include, but are not limited to, gases such as chlorine, metallic particles such as nickel, iron, platinum and radiation such as UV light of a wavelength and intensity sufficient to increase to increase surface atomic mobility. It will be recognized that the use of such agents may cause impurities to be incorporated into the diamond ceramic, but in some instances the incorporation of such impurities as dopants, may be desirable to impart semiconductor properties to the diamond ceramic.

It will be appreciated from the above that particularly if the diamond mass is large enough, that grain consolidation may be effected at the above temperatures using only a source of atomic hydrogen, without a carbon source gas. By the constant vaporization and redeposition of carbon in the presence of atomic hydrogen it is believed that the interstitial spaces among the grains will be consolidated into a hard mass. However, the rate of consolidation and the ultimate density and size of the mass may be enhanced by use of a carbon source gas.

While apparatus for PECVD of carbon gases onto diamond seed particles are known and readily constructed by those of ordinary skill in the art, it is a particularly preferred aspect of the present invention to heat the diamond particulate mass without directly heating the walls of the deposition chamber. Thus the requisite heat may be applied in such a manner by using a non-thermal source of energy such as induction, radiation, or microwave energy, ultraviolet radiation, etc., as described hereinabove.

Having described the above preferred embodiments it will be apparent to those skilled in the art that various modifications and alterations may be made without departing from the spirit and scope of the invention, which modifications and alterations are intended to be within the scope of the present invention. The present invention is not deemed to be limited by any of the foregoing description and is defined by the following claims.

What is claimed is:

1. A process for consolidating diamond particles into a mechanically stable diamond mass comprising the step of contacting a compacted aggregation of diamond particles with atomic hydrogen under conditions whereby said particles gasify and redeposit as a mechanically stable diamond mass substantially devoid of interstitial spaces, said atomic hydrogen generated by impinging molecular hydrogen on to one surface of catalytic matrix, wherein said molecular hydrogen is of a sufficient velocity and the density and thickness of said matrix is sufficient to cause dissociation of said molecular hydrogen to atomic hydrogen whereby atomic hydrogen is evolved at the opposite surface of said matrix.

2. A process according to claim 1 wherein said catalytic matrix is selected from the group consisting of platinum, palladium, nickel, Raney nickel, lead, and other hydrogenation catalysts.

3. A process according to claim 2 wherein said matrix comprises palladium.

* * * * *

UNITED STATES PATENT AND TRADEMARK OFFICE
CERTIFICATE OF CORRECTION

PATENT NO. : 5,075,095
DATED     : December 24, 1991
INVENTOR(S) : John M. Pinneo It is certified that error appears in the above-indentified patent and that said Letters Patent is hereby corrected as shown below:

Title page, item [*] Notice, replace "Nov. 21, 2006" with --March 30, 2007.

Title page, item [63], replace "Apr. 15, 1987" with --March 30, 1987.

Signed and Sealed this

Twenty-ninth Day of July, 1997

Attest:

BRUCE LEHMAN

*Attesting Officer*      *Commissioner of Patents and Trademarks*